United States Patent [19]

Cloke

[11] Patent Number: 4,506,236
[45] Date of Patent: Mar. 19, 1985

[54] COMPOSITE FILTER/DIFFERENTIATOR

[75] Inventor: Robert L. Cloke, Santa Clara, Calif.

[73] Assignee: Sperry Corporation, New York, N.Y.

[21] Appl. No.: 449,883

[22] Filed: Dec. 15, 1982

[51] Int. Cl.³ .................. H03H 7/48; H03H 17/00; H03K 9/04
[52] U.S. Cl. .................... 333/19; 307/355; 329/104; 333/20; 333/167; 360/36.1
[58] Field of Search ............... 333/167–168, 333/19–20, 1, 100, 138–140; 360/25–27, 32, 36.1, 36.2, 39, 41–46, 48, 65, 67, 68; 329/104–109, 126, 146–147, 207; 307/231, 354–363, 440, 463, 494, 511, 518

[56] References Cited

U.S. PATENT DOCUMENTS 2,609,448 9/1952 Bedford et al. .................. 333/138

Primary Examiner—Marvin L. Nussbaum
Attorney, Agent, or Firm—John B. Sowell; Thomas J. Scott; Marshall M. Truex

[57] ABSTRACT

There is shown and described a relatively simple electronic circuit using few discrete components which is used to replace the filter and delay line differentiator in existing circuits. The new circuit provides a simultaneous output of even and odd signals which have the same transfer function except for the derivative operation. The circuit is especially useful in read and write channels of a disk drive apparatus.

9 Claims, 5 Drawing Figures

COMPOSITE FILTER/DIFFERENTIATOR

BACKGROUND

1. Field of the Invention

This invention is a circuit which is used in disk drive systems, in general, and, more particularly, is used in the read/write channels of such disk drive systems.

2. Prior Art

There are many known disk drive systems available in the market. These systems have been provided for many years. Of course, the complexity and operating characteristics of such systems has increased over the years so that the systems are intended to operate on more information, at a higher throughput rate, with geater density, and the like. As more and more requirements are placed on the systems, more and more research and development is necessary to permit the system to react to the requirement demands. Unfortunately, sometimes the requirement demands have caused the circuits to become significantly more complex than the predecessor circuitry. Typically, the complexity permits (or attempts to permit) greater reliability of the information handling aspects of the system while permitting the system to handle more information, more rapidly.

For example, it has been known in the past, to provide circuits with specific transfer functions for signal transmission therethrough. However, in attempting to work within the confines of these transfer functions, other requirements have been encountered. For example, the use of one transfer function has necessitated the use of transfer functions of other circuitry which have different characteristics. Consequently, the circuits have been required to be modified, electrically, to cause the transfer functions to match up more closely. This complexity, in and of itself, creates additional problems for the system. Moreover, the complexity makes these systems highly more complex and, as a consequence, much more expensive to build and maintain.

Consequently, it is highly desirable to obtain circuitry which will perform similar functions in a much less complex fashion. The reduction in complexity has the obvious advantages of producing a more reliable circuit which is less expensive to produce.

SUMMARY OF THE INVENTION

This invention is directed to a composite filter/differentiator network. The filter/differentiator network is directed to a relatively simple circuit comprising only linear passive components, such as inductors, capacitors, or resistors. The circuit generates a derivative of certain signals and, effectively, filters other signals. The circuit provides a simultaneous output of even and odd function signals wherein delay line circuitry is omitted.

DESCRIPTION OF A PREFERRED EMBODIMENT

Figure 1:
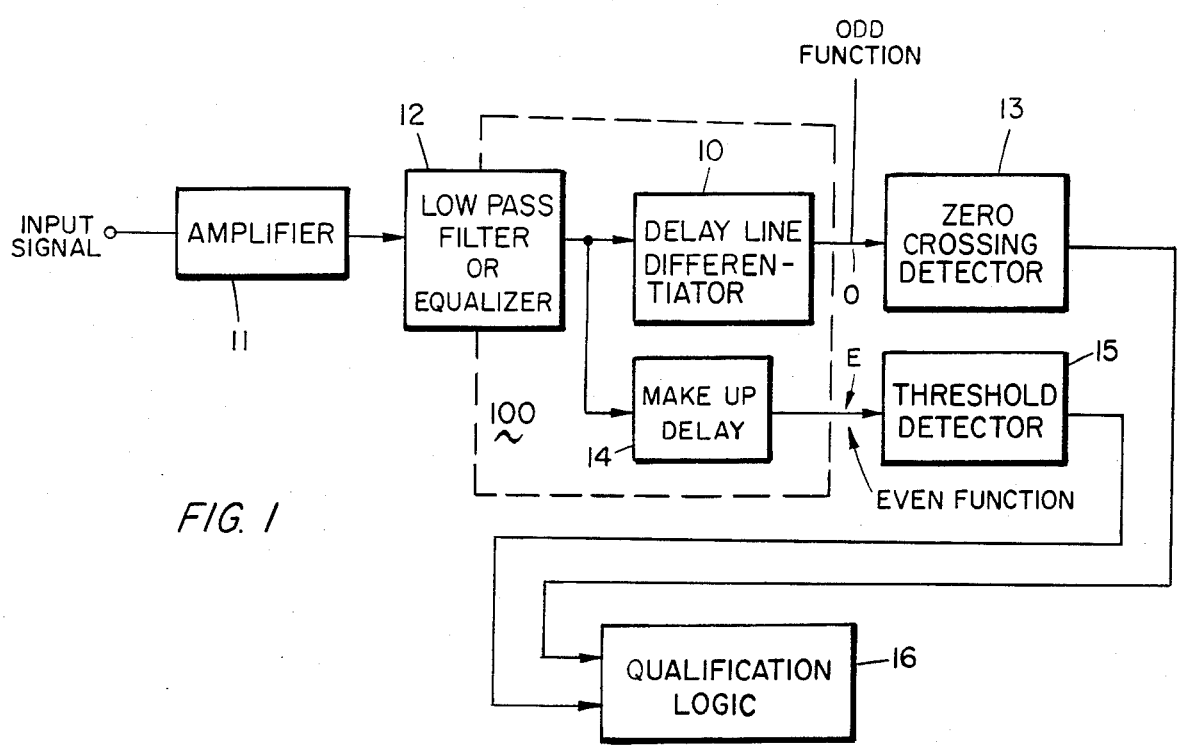
FIG. 1 is a block diagram of a read/write channel used in disk drive circuitry.

Referring now to FIG. 1, there is shown a schematic diagram of a typical read channel used with disk drive assemblies known in the art. The channel receives an input signal from any suitable apparatus such as the head in a disk drive machine. The input signal is supplied to an amplifier 11 of standard configuration which is intended to amplify the input signal so as to be more readily useful. The output of amplifier 11 is supplied to lowpass filter circuit 12 which can be of any standard circuit configuration so as to provide low pass filter operation. In addition, filter circuit 12 can be an equalizer which has the effect of slimming the read pulses to allow greater packing density. The output of low pass filter 12 is connected to delay line differentiator 10 and to the input of make-up delay circuit 14. The output of delay circuit 14 is supplied to the input of threshold detector 15. The output of delay line differentiator 10 is supplied to the input of zero-crossing detector 13. The outputs of detectors 13 and 15 are connected to inputs of qualification logic 16 which can be of any suitable configuration to ascertain when signals are properly supplied from the detectors 13 and 15 in order to produce a digital output signal. The digital output signal from logic circuit 16 is supplied to any suitable utilization device.

It is noted that the output of low pass filter 12 is connected to node E through make-up delay 14 . Node E is the node where the "even function" is detected. The output of delay line differentiator 10 is supplied to node 0 which is the detection point for the "odd function". The "even function" is so-named because the symmetry thereof is such that fe(t)=fe(−t), where t=0 is the peak of the signal. Likewise, the "odd function" is so-named because it follows the form fo(t)=−fo(−t).

This circuitry is typical in the art. That is, the input signal is supplied from the read head, amplified and passed through the low pass filter in order to delete the high frequency noise signals. The even function signal is operated upon by the threshold detector circuit 15 and qualification logic circuit 16 to determine if a signal peak is of sufficient amplitude that the derivative at the zero-crossing produced by delay line differentiator 10 and zero-crossing detector 13 is valid. In addition, delay circuit 14 is used to correct the timing of the even function signal so that the peak thereof is aligned with the zero-crossing signal of the odd function which has been delayed while passing through the delay line differentiator 10. That is, delay line differentiator 10 receives the signal and produces a derivative thereof. The derivative of the signal is zero when the signal is at a maximum or peak. This derivative signal is then produced as the odd function signal. Clearly, the odd function signal or zero-crossing which is detected by a zero-crossing detector 13 is delayed relative to the input to the delay line differentiator 10 because of the delay imposed by differentiator 10. Consequently, make-up delay 14 is required to realign the signals. Obviously, this creates a problem area in the prior art networks. In addition, the complexity of the circuits is increased.

As will be more readily understood hereinafter, the invention described herein provides a circuit which replaces the delay line differentiator 10, the make-up delay 14 and a portion of filter 12 (as suggested by dashed block 100) with a much more simplified circuit. In addition, the circuit of the invention will reduce (and in some cases eliminate) the filter circuit 12.

Figure 2:
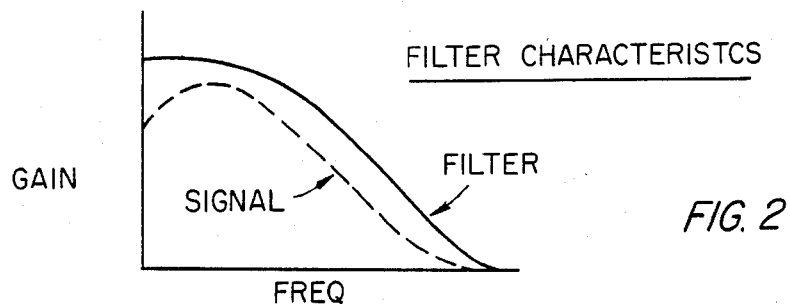
FIG. 2 is a graphic representation of filter characteristics as related to a signal spectrum.

Referring now to FIG. 2, there is shown a graphic representation of a signal spectrum of a signal produced by a disk drive read head. This signal, shown in dashed outline, has much reduced amplitude as each frequency increases. The typical filter characteristic is shown in a solid line. The filter characteristic has high frequency roll-off inasmuch and there is very little signal amplitude in the signal produced. However, the filter characteristic shown in FIG. 2 preserves the signal integrity, i.e., both amplitude and delay (at low frequency). Thus, one characteristic of the desired circuit component is shown in FIG. 2.

Figure 3:
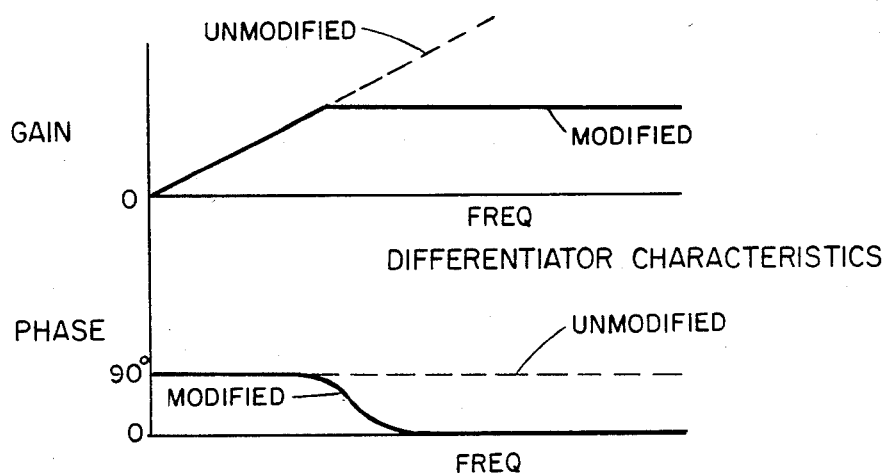
FIG. 3 is a graphic representation of operating characteristics of a differentiator network.

In the time domain, the information which is recorded and represented by the signal received from the head is best described by the time position of the readback peaks. However, the time position of a zero-crossing is much easier to detect electronically than is the position of a peak of a signal. Consequently, it is typical to differentiate the input signal to convert the peaks to zero-crossings. The frequency response of a typical differentiator is known to have the characteristics wherein (1) the gain is proportional to frequency and (2) the phase is a constant 90° leading. These characteristics are shown in FIG. 3. In the normal situation, the differentiator gain continues to increase with frequency an the phase continues to remain flat at +90°. These characteristics are shown in FIG. 3 with the normal condition extended by the dashed line. It is clear that if the differentiator gain is continuously increasing with frequency, the filter roll-off becomes much less effective at high frequency.

In order to overcome this problem, it is well-known to modify the differentiator characteristics. One such approach is to insert a high frequency pole in the differentiator as a gain stop. The result causes the gain to achieve a certain level and to then become essentially flat as shown in solid line in FIG. 3. It will be noted, as also shown in FIG. 3, that the phase shift for the circuit is no longer a constant 90° but varies, nonlinearly, with frequency. The phase shift tends to introduce a waveform distortion which is undesirable.

Figure 4:
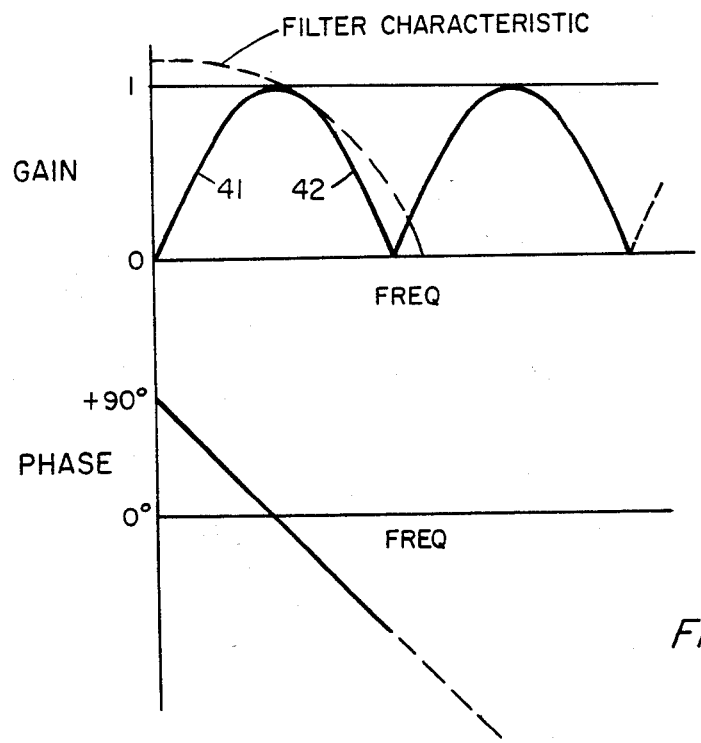
FIG. 4 is a graphic representation of a delay line differentiatior transfer function related to filter characteristics.

A second method of modifying the differentiator is to use a delay-line differentiator which produces a frequency response as shown in FIG. 4. It is noted that the gain never exceeds unity and that the phase shift is 90° at 0 frequency and decreases linearly with frequency. This corresponds to a 90° phase shift plus a pure delay. The delay, as it turns out, is unimportant as far as distortion is concerned but has to be accounted for in the detection system design such as by inserting a make-up delay circuit 14.

In the differentiator of this type, the rising or leading portion 41 of the first lobe of the gain characteristic is that portion which is used to approximate the ideal differentiator. The falling slope 42 of the first lobe is used to enhance the rate of cutoff of the low pass filter. The signal and noise components which would have appeared in the higher order lobes are typically attenuated by the filter characteristics (shown dashed) as noted above because of the high frequency roll-off thereof.

Figure 5:
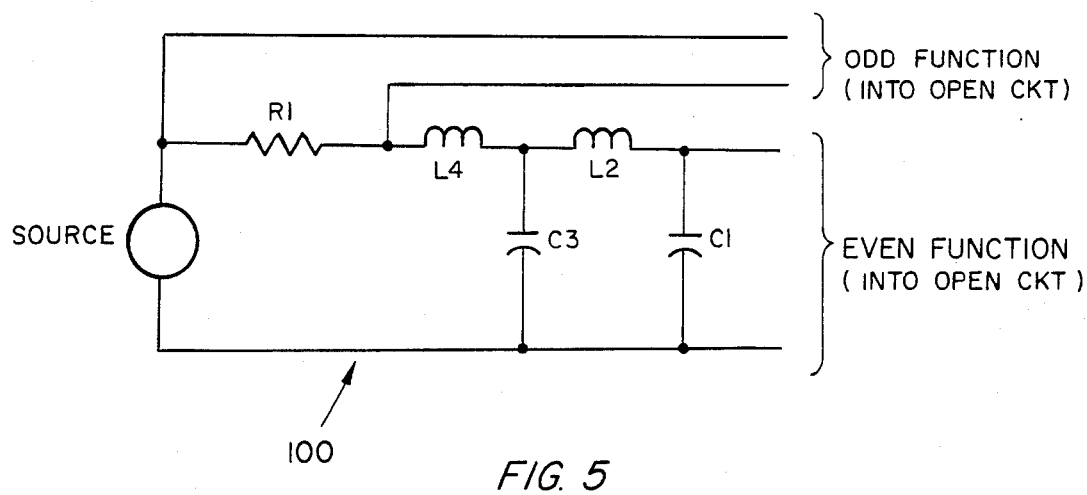
FIG. 5 is a schematic representation of a composite filter/differentiator of the instant invention.

As noted above, the present invention utilizes a new and unique differentiator circuit to simplify and/or eliminate delay line differentiator 10, make-up delay circuit 14 and at least part of filter circuit 12. The composite filter/differentiator 100 can have several related configurations. A preferred embodiment is shown in FIG. 5. However, it must be recognized that the circuit 100 can have several related configurations (i.e. duals). More particularly, the composite filter/differentiator 100 of this invention is a low pass filter circuit which uses both the transmission properties (for the even function) and reflection properties (for the odd function) of an L-C network terminated only at its input, i.e., the circuit is open-ended at the output. A typical L-C circuit to be used in this invention is shown. However, a preferred embodiment would use a 4-pole Bessel design because of the constancy of the delay function beyond the peak frequency of the first lobe of the odd function response as suggested in FIG. 4.

The values for the elements involved in the differentiator network are obtained from any filter design handbook such as "The Handbook of Filter Synthesis" by A. I. Zverev. One table from the handbook is reproduced herewith as Table I. The utilization of the handbook page relative to normalized network is shown and described. It must be understood, that this illustrative analysis is not limitative of the invention. Additional circuits can be used with additional tables of the handbook. Typically, the number of stages of the differentiator circuit can be increased to the extent desirable and as shown and described in the noted handbook. The examples shown are directed at a network having 4 reactive components (n=4).

TABLE I

| n | $R_s$ | $C_1$ | $L_2$ | $C_3$ | $L_4$ |
|---|---|---|---|---|---|
| 4 | 1.0000 | 0.2334 | 0.6725 | 1.0815 | 2.2404 |
|   | 1.1111 | 0.2085 | 0.7423 | 0.9670 | 2.4143 |
|   | 1.2500 | 0.1839 | 0.8292 | 0.8534 | 2.6304 |
|   | 1.4286 | 0.1596 | 0.9406 | 0.7410 | 2.9066 |
|   | 1.6667 | 0.1356 | 1.0886 | 0.6299 | 3.2727 |
|   | 2.0000 | 0.1120 | 1.2952 | 0.5202 | 3.7824 |
|   | 2.5000 | 0.0887 | 1.6040 | 0.4120 | 4.5430 |
|   | 3.3333 | 0.0658 | 2.1174 | 0.3056 | 5.8048 |
|   | 5.0000 | 0.0434 | 3.1416 | 0.2013 | 8.3185 |
|   | 10.0000 | 0.0214 | 6.2086 | 0.0993 | 15.8372 |
|   | INF | 1.5012 | 0.9781 | 0.6127 | 0.2114 |
| n | $1/R_s$ | $L_1$ | $C_2$ | $L_3$ | $C_4$ |

In essence then, the network is analyzed relative to the impedance thereof. When the impedance of the components, i.e. L's, C's and R, are properly selected, the design provides a desired "odd function". This desired odd function provides zero amplitude at zero frequency with a constant delay. The constancy of delay is related to the choice of poles of the transfer function. However, it has been discovered that by using this type of circuit, the odd function which is produced also has a constant delay and an amplitude function closely approximating a delay-line differentiator. These characteristics were totally unexpected and the advantages thereof are readily apparent.

As is well known in filter circuit theory, the greater the order (i.e. number) of stages, the greater the accuracy of the circuit. The accuracy of interest in this application is the flatness (constancy) of delay. Nevertheless, the greater the number of stages the greater the accuracy.

In discussing the circuit of the instant invention, a typical example is provided. This example makes use of the data in Table I. It is well known that by using the Bessel functions noted in the handbook, a design for a current driving source or for a voltage driving source can be produced. In the case of the current source, the source resistance is considered to be connected in parallel with the source. Conversely, in the voltage driven circuit, the source resistance is considered to be connected in series with the source. By inverting the Table, the dual of the circuit can be described. Moreover, by reversing the order of reading the Table I, i.e. reading the columns from right-to-left rather than from left-to-right, a circuit which works into an infinite-resistance load can be described. For example, in a normalized situation for a circuit with four (4) stages (n=4) reference is made to the Table I where n=4.

Because an open-circuit load is desired, the reading is from the top of the Table I wherein $R_s$ is infinite. (If $1/R_s$ were infinite, then $R_s$ would be equal to 0 and this would be a shorted termination network.)

In the open-ended network, C1 is equivalent to the output capacitor and has a value of 1.5012 (318.6). Likewise, inductor L2 has a normalized value of 0.9781 (2.076). Also C3 is 0.6127 (130.0) and L4 is 0.2114 (0.4486) and so forth as is observable from the proper row and column in the Table I reproduced above.

Incidentally, in the normalized version, all of the inductors are in henries, all the capacitors are in farads and the resistors are in ohms. The numbers in the above illustration are based upon a radian frequency of $w=1$ and a resistance value of $R=1$. In the situation with a radian frequency of $w=2\pi \times 7.5$ MHz and a resistance value of $R=100$, the values listed in parentheses in the paragraph above will obtain. However, these values are: inductors are in microhenries; capacitors are in picofarads; and resistances are in ohms.

A review of the plot of the gain and group-delay-versus-frequency for various orders of filters will show that a differentiator with a third or fourth order configuration is satisfactory. That is, the delay for differentiators of these orders of configuration is sufficiently small up to the peak of the gain-versus-frequency curve, that is, that portion of the curve where the approximation to ideal differentiation exists.

It will be noted that the delay for the even channel output is exactly the same as the delay for the odd channel output after accounting for the $+90°$ phase shift required for the differentiator action.

It will also be noted that the gain of the even channel output is the same as that of the Bessel low pass filter. This is not surprising inasmuch as this is the prototype information from which the network was derived.

Thus, there is shown and described an improved channel frequency response circuitry network. The network comprises a specifically designed filter network which takes into consideration the required characteristics for a specific feature such as the odd function of a desired signal. It has been found that by using the LC circuit in open-ended termination with the calculated even function characteristic, the odd function characteristic is also obtained with only a constant phase difference which is that required for differentiation in the odd output. The advantage of this simple R, L, C circuit is to provide a highly simplified circuit which provides greater accuracy for the overall system. While certain examples have been given, these examples are illustrative only and are not intended to be imitative of the invention. The scope of the invention is limited only by the claims appended hereto.

Having thus described a preferred embodiment of the instant invention, what is claimed is:

1. An open-ended composite filter/differentiator circuit which simultaneously produces an even function and an odd function of a transfer function supplied thereto in a read/write channel, comprising
   energy source means,
   resistance means connected to said source so as to develop the odd functions relative thereto, and
   inductance means and capacitance means connected together to form an open-ended impedance network which is connected to said source means and to said resistance means so as to develop the even function across the open-ended portion of said network.
2. The circuit recited in claim 1 wherein,
   said energy source means is a constant voltage source, and
   said resistance means includes a resistor connected in a series with said source means and said odd function is developed across said resistor.
3. The circuit recited in claim 1 wherein,
   said inductance means and said capacitance means comprise an inductor and capacitor ladder circuit.
4. The circuit recited in claim 3 wherein,
   said ladder circuit comprises at least a 3-pole Bessel design.
5. The circuit recited in claim 1 wherein,
   said capacitance means produces said even function into an open circuit configuration.
6. The circuit recited in claim 1 wherein,
   said resistance means produces said odd function into an open circuit configuration.
7. The circuit recited in claim 1 including,
   amplifier means for supplying signals to said source means,
   first detector means connected to receive said odd function from said capacitance means,
   second detector means connected to receive said even function from said inductance means, and
   qualification logic means connected to receive signals from each of said first and second detector means to selectively produce output signals.
8. The circuit recited in claim 7 wherein,
   said qualification means produces digital output signals.
9. The circuit recited in claim 1 wherein,
   said energy source means is a constant current source, and
   said resistance means includes a resistor connected in parallel with said source means and said odd function is developed through said resistor.

* * * * *